United States Patent [19]

Yokoyama et al.

[11] Patent Number: 4,820,145
[45] Date of Patent: Apr. 11, 1989

[54] POLYCRYSTALLINE SILICON WAFER TRAY

[75] Inventors: Takashi Yokoyama; Ichiro Hide; Keiji Sawaya; Takeshi Matsuyama, all of Sapporo, Japan

[73] Assignee: Hoxan Corporation, Japan

[21] Appl. No.: 926,131

[22] Filed: Nov. 3, 1986

Related U.S. Application Data

[63] Continuation of Ser. No. 594,107, Mar. 28, 1984, abandoned.

[30] Foreign Application Priority Data

Mar. 30, 1983 [JP] Japan ................... 58-54453
Mar. 31, 1983 [JP] Japan ................... 58-56592
Dec. 14, 1983 [JP] Japan ................ 58-192615[U]

[51] Int. Cl.⁴ .............................................. A01J 21/00
[52] U.S. Cl. .................................... 425/425; 425/434; 425/435; 264/311
[58] Field of Search ................. 425/425, 434, 435; 264/311; 164/289, 290

[56] References Cited

U.S. PATENT DOCUMENTS

| | | | |
|---|---|---|---|
| 4,350,481 | 9/1982 | Corea et al. | 425/73 |
| 4,478,567 | 10/1984 | Schaer | 425/150 |
| 4,479,769 | 10/1984 | Simioni | 425/434 |
| 4,517,140 | 5/1985 | Rawlings | 264/2.1 |
| 4,519,764 | 5/1985 | Maeda et al. | 425/256 |

FOREIGN PATENT DOCUMENTS

| | | | |
|---|---|---|---|
| 2211705 | 9/1972 | Fed. Rep. of Germany | 264/311 |
| 81901 | 1/1947 | France | 164/290 |
| 793703 | 7/1981 | U.S.S.R. | 164/290 |

*Primary Examiner*—Bernard Nozick
*Attorney, Agent, or Firm*—Fleit, Jacobson, Cohn & Price

[57] ABSTRACT

A polycrystalline silicon wafer having the step of flowing in a predetermined atmosphere molten liquid of silicon base material on a rotating fabrication tray toward a radial direction by means of a centrifugal force produced by the rotation of the tray, thereby forming a thin molten material layer of desired diameter with the molten liquid and solidifying the molten material, comprising a cover, at which a through hole is perforated at the ceiling wall thereof, detachably covered on the tray, a wafer-molding space formed to be surrounded by the cover and the tray, the molten material being filled in the wafer-molding space via the through hole to form a thin molten material layer. Thus, the wafers can be simultaneously formed without production of small projections of the surface of the wafers.

1 Claim, 5 Drawing Sheets

POLYCRYSTALLINE SILICON WAFER TRAY

This is a continuation of application Ser. No. 594,107 filed Mar. 28, 1984, now abandoned.

BACKGROUND OF THE INVENTION

This invention relates to a method of fabricating a polycrystalline silicon wafer used for a solar battery, a photoelectric converter, etc. and a fabrication tray capable of executing the method.

A polycrystalline silicon wafer is heretofore fabricated by a variety of methods. Generally, an ingot of prescribed shape is temporarily cast from a silicon base material, and is then sliced to fabricate a wafer. Since this conventional method takes a long time to slice the ingot and yet approx. 50% of the ingot is wasted at the time of slicing the ingot, the product of the wafer becomes expensive, and it is further impossible to fabricate a number of wafers in a mass production.

A ribbon method and a casting method are already executed as a method without slicing step for that purpose. The ribbon method has, for example, the steps of injecting molten silicon to the peripheral surface of a rotating drum and forming a ribbon-shaped wafer on the peripheral surface of the drum. According to this ribbon method, the ribbon having a width of several millimeters can only be fabricated, and it has such difficulty that a solar battery cell of large size cannot be fabricated.

The casting method has the steps of heating a silicon base material into its molten liquid, pouring the molten silicon material in a mold prepared in response to the size of the wafer of the product, and further press molding the molten material by the movable mold to solidify the molten material. According to this casting method, the wafer of prescribed shape can be obtained simultaneously and a preferred result can be expected at the viewpoint of its mass production, but the molten silicon base material is urged from all the peripheral directions.

Thus, the growth of silicon crystalline grains is disadvantageously suppressed according to this casting method when the molten silicon material is solidified among the upper, lower and side surfaces of the casting mold. This causes the vicinity of the parts of the silicon material to be solidified in contact with the upper, lower and side surfaces of the mold to become extremely fine crystalline grains, but cannot obtain large crystalline grains. This does not satisfy the requirements of the fabrication of large crystalline grains which are desired for a silicon wafer used for a solar battery cell. Accordingly, the photoelectric conversion efficiency of the solar battery thus obtained with the wafer is remarkably deteriorated to 2 to 3% as its drawbacks and disadvantages.

The inventors of the present invention have already proposed, as a method of fabricating a polycrystalline silicon wafer capable of largely improving the disadvantages of the above-described conventional methods, a method (a spinning method) which has the steps of melting a silicon base material, dropping the molten material on a rotating fabrication tray formed of quartz or carbon, forming a thin molten material layer of desirably increased diameter by utilizing centrifugal force, solidifying the molten material layer, and then isolating the silicon sheet from the tray.

This spinning method has a number of excellent features, but when the thin molten material layer is solidified, the expanded portion of the molten material produced when the molten material is solidified at high temperature affects the volumetric expansion which occurs at that time relative to the free surface of the molten material which was originally smooth, and small projections are disadvantageously formed in groups on the surface of the silicon sheet of the resultant product (on the opposite to the bonded surface which is surface-contacted with the surface of the tray).

In the conventional method, the small projections should be removed by various etchants and the surface of the silicon sheet should be smoothly finished by manual works. This work is extremely complicated, and when the height of the projections is higher than 0.5 mm, the removal of etchants becomes impossible, resulting in the large decrease in the production efficiency.

SUMMARY OF THE INVENTION

Accordingly, there is provided a first embodiment of this invention by considering the aforementioned drawbacks, and a primary object of this invention is to provide a method of fabricating a polycrystalline silicon wafer, which can eliminate the production of small projections on the surface of a silicon sheet when fabricating the wafer by a spinning method already proposed by the inventors of the present invention and can facilitate smooth surface of the wafer in high efficiency.

There is further provided as another embodiment of this invention a fabrication tray adapted to be used for executing the above-described method of the invention, which can improve the productivity and can simultaneously fabricate a plurality of polycrystalline silicon wafers.

There is still further provided as yet another embodiment of this invention a fabrication tray of stack type, which can simultaneously fabricate many more polycrystalline silicon wafers.

There is still further provided as a further embodiment of this invention a fabrication tray which is constructed to flow the molten stream of silicon base material sufficiently smoothly toward a diameter-expanding direction, thereby eliminating the fabrication of irregular polycrystalline silicon wafers due to irregular flow.

In order to achieve the above object of the first embodiment of this invention, there is provided a method of fabricating a polycrystalline silicon wafer having the step of flowing in a predetermined atmosphere molten liquid of silicon base material on a rotating fabrication tray toward a radial, direction by means of a centrifugal force produced by the rotation of the tray, thereby forming a thin molten material layer of desired diameter with the molten liquid and solidifying the molten material, comprising a cover, at which a through hole is perforated at the ceiling wall thereof, detachably covered on the tray, a wafer-molding space formed to be surrounded by the cover and the tray, the molten material being filled in the wafer-molding space via the through hole to form a thin molten material layer.

The above and other relates objects and features of the invention will be apparent from a reading of the following description of the disclosure found in the accompanying drawings and the novelty thereof pointed out in the appended claims.

DESCRIPTION OF THE PREFERRED EMBODIMENTS

The present invention will be described in more detail with reference to the accompanying drawings.

Figure 1:
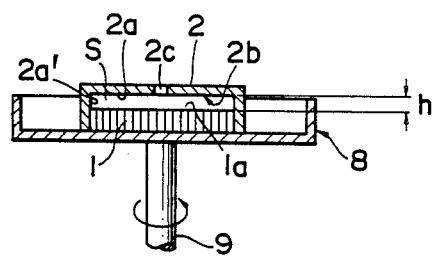
FIG. 1 is an explanatory longitudinal sectional view showing a fabrication tray mounted with a cover for executing the method of fabricating a polycrystalline silicon wafer according to a first embodiment of the present invention.

FIG. 1 shows a fabrication tray formed of a tray body 1 and a cover 2 capable of being used for executing a method of fabricating a polycrystalline silicon wafer of this invention in the state set onto a turntable 8.

The tray body 1 may be formed of quartz ($SiO_2$) or carbon (C), etc. which is preferably less reactive with silicon, is prepared to have a wafer-forming surface 1a of desired shape such as circular or square shape of various sizes, which are arbitrarily selected.

The cover 2 may be also formed of quartz ($SiO_2$) or carbon (C), etc. which is preferably less reactive with the silicon, is formed in the shape of its inner periphery in intimate contact with the outer periphery of the tray body 1, and when the cover 2 is placed on the tray body 1 and placed on the upper surface of the turntable 8 as shown, a wafer-forming space S of a predetermined volume is formed by the wafer-forming surface 1a of the tray body 1, the ceiling wall 2a of the cover 2 and the lower surface 2b by the peripheral wall 2a'. This wafer forming space S is variably formed in height h corresponding to the thickness of the wafer by preparing covers 2 of various heights, and a through hole 2c of a predetermined diameter is perforated substantially at the center of the ceiling wall 2a of the cover 2.

The cover 2 thus constructed is engaged with the fabrication tray 1 which is placed on the upper surface 10 of the turntable 8, as shown in FIG. 1, the wafer-forming space S is formed, and molten silicon base material is then filled in the space S through the hole 2c of the cover 2, thereby forming a thin molten silicon base material layer 3.

Figure 2:
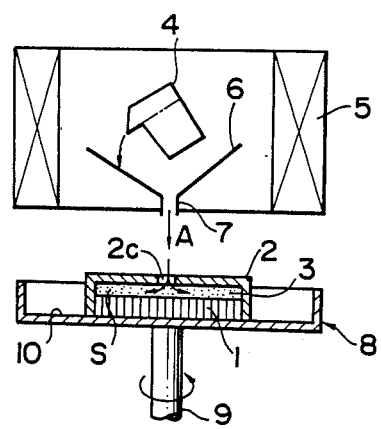
FIG. 2 is a partial explanatory longitudinal sectional view showing the state that molten material is filled in a wafer-forming space formed between the fabrication tray and the cover according to the first embodiment of the present invention.

In order to form this thin molten material layer 3, a silicon base material is thrown into a crucible 4, as shown in FIG. 2, heated by a heat source 5 for melting, and is thus molten. The molten material is then flowed out to a funnel 6 by tilting the crucible 4, temporarily received by the funnel 6, and dropped, as shown by an arrow A in FIG. 2 substantially to the center of the hole 2c of the cover 2.

In this case, the turntable 8 may be preferably turned in advance, but may start turning simultaneously before the molten material is solidified after completely dropped. The molten material is flowed by the centrifugal force due to the rotation of the turntable 8 radially outwardly. Thus, the molten material is gradually flowed into the wafer-forming space S, and eventually fully filled in the space S, thereby forming a predetermined thin molten material layer 3. In this case, air filled in the space S is evacuated out of the cover 2 through the hole 2c of the cover when the molten material is flowed radially outwardly by the centrifugal force of the turntable 8.

When the thin molten material layer 3 is formed, it should be noted that, since the hole 2c is opened at the cover 2, the molten material would be flowed into the hole 2c when the molten material more than the volume of the space S is filled in the space, with the result that projections corresponding to the excess flowed amount are formed on the surface side of the thin molten material layer 3. Accordingly, in executing the method of the present invention, the quantity of filling the molten material should preferably be controlled corresponding to the volume of the space S.

Figure 9A:
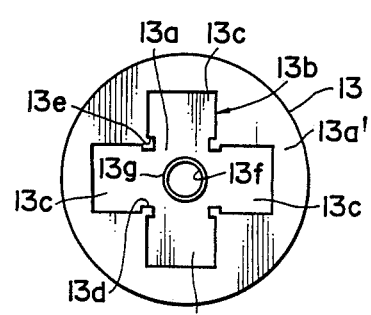
FIGS. 9(a) and 9(b) are respectively plan and longitudinal sectional views of a tray body with respect to the third layer of the tray.
Figure 9B:
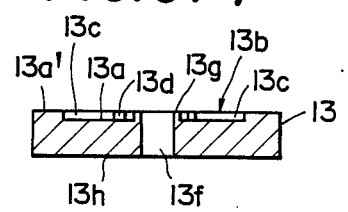

The silicon base material may be metallic silicon, semiconductor high purity silicon, etc. The base material is heated by the heat source 5 for melting such as an electric heater arranged on the outer peripheral side of the crucible 4 by considering 1,420° C. of the melting point of the silicon, and is thus molten. The heat source 5 may be, as shown in FIG. 2, an electric heating wire, a high frequency heater, which is preferably stopped suitably heating or controllable in the heating condition. In FIG. 9, reference numeral 9 designates a rotational shaft of the turntable 8.

Figure 3:
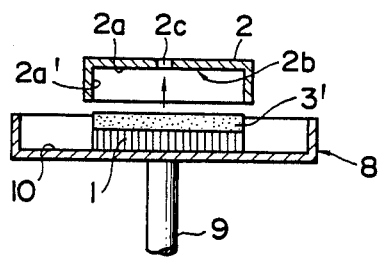
FIG. 3 is an explanatory longitudinal sectional view of the state that the cover after formed with a silicon sheet is removed in the first embodiment.
Figure 4A:
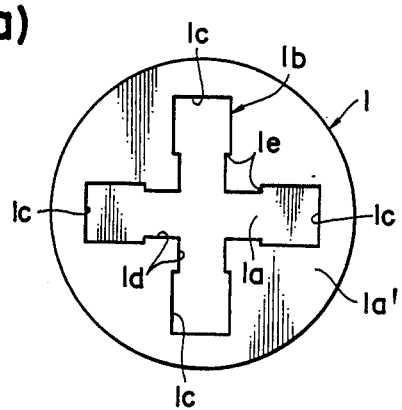
FIGS. 4(a) and 4(b) are respectively plan and longitudinal sectional front views of a fabrication tray according to a second embodiment of the present invention.
Figure 4B:
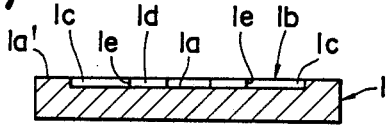
Figure 5A:
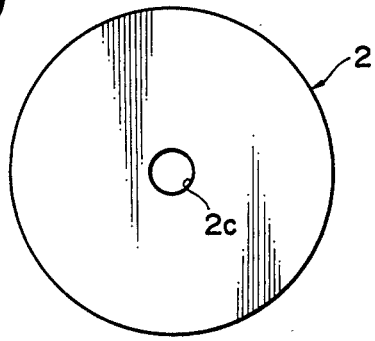
FIGS. 5(a) and 5(b) are respectively front and longitudinal sectional front views of the fabrication tray with the cover.
Figure 5B:
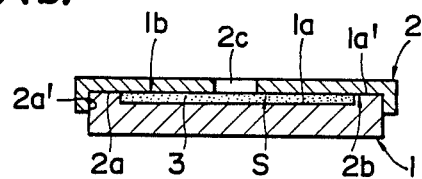

When the molten material is filled in the wafer-forming space S in this manner and the thin molten material layer 3 is thus formed, the layer is cooled, solidified, the cover 2 is then raised as shown in FIG. 3, and a silicon sheet 3' of the product is isolated from the tray body 1, thereby obtaining a wafer which has smooth surface.

More specifically, according to the method of fabricating the polycrystalline silicon wafer of the present invention, the front and back surfaces of the thin molten material layer 3 as well as the outer peripheral surface of the layer 3 are surrounded by the body tray 1 and the cover 2. Accordingly, when the thin molten material layer 3 is cooled and solidified, a trend that small projections are formed on the free surface can be suppressed by the inner surface of the cover 2.

More concretely according to this invention, when a silicon sheet having 100 mm diameter and 1 mm of thickness is fabricated, silicon of 18.5 g. is prepared since specific weight of the silicon is 2.3 g./cm$^3$. This silicon is then heated and molten at approx. 1,500° C., the fabrication tray is then heated and controlled at 1,350° to 1,430° C., rotated at 200 to 350 r.p.m., the molten material is then filled in the wafer-forming space through the hole of the cover, thereby forming a thin molten material layer of a predetermined diameter.

Subsequently, the fabrication tray is stopped heating, the thin molten material layer is then cooled, solidified, and the cover is removed, and the silicon sheet is isolated from the fabrication tray.

Consequently, the wafer thus fabricated did not exhibit small projections or the like as described above, but could confirm the fabrication of a wafer having smooth surfaces.

According to the method of this invention, it was also confirmed that silicon crystal grains of approx. 1 mm to 10 mm could be readily produced.

In case of carrying out the method of the present invention, when the fabrication tray is heated in advance to the vicinity of approx. 1,400° C. by heating means such as a heater or the like, a wafer of product having desirable large crystalline grains can be readily fabricated.

In other words, in order to produce a wafer having large crystalline grains, molten silicon base material is heated to a high temperature, and may be gradually cooled without abruptly cooling, known per se, but in the spinning method proposed by the same inventors as the present invention, the higher the temperature of the molten silicon base material is increased, the more the material is scattered, with the result that no wafer is produced. This problem can also be eliminated by the present invention since the outer periphery of the body tray 1 is surrounded by the cover 2, and the molten material of high temperature is not scattered, but the resulting wafer of large crystalline grains can be readily fabricated.

According to the present invention as described above, difficulties of employing a conventional ingot slicing method or a ribbon method can be eliminated, and further it is not pressed by the surfaces of a cast mold such as an existing casting process and the production of small projections can be suppressed. Accordingly, the wafer may be readily formed entirely with smooth surface, a cost can be reduced, and yet the wafer of large crystalline grains can be fabricated conveniently.

Then, FIGS. 4(a), 4(b) and 5(a), 5(b) show a tray body 1 and a cover 2 of a fabrication tray as the second embodiment of the present invention used for executing the method of the present invention. The materials and shapes of them are the same as those of the first embodiment of the invention. A wafer forming groove 1b of planar cross shape is formed on the upper surface 1a' of the tray body 1, the bottom is formed as a wafer forming planar surface 1a, and the wafer-forming space S is formed of the ceiling wall 2a of the cover 2, the groove 1b and the wafer-forming space S is formed of lower surface 2b is formed of the groove 1b, the lower surface 2b of the ceiling wall 2a of the cover 2. On the wafer-forming groove 1b is formed of four wafer-forming units 1c of square shape in the embodiments shown in the drawing, the coupler 1d communicating with the wafer-forming unit 1c is formed in a fine width even as compared with the forming unit 1c, and a notched part 1e is formed at the coupling position of the wafer-forming unit 1c and the connecting part 1d communicating with the respective wafer-forming units 1c., thereby forming a notched part 1e.

The cover 2 may be formed of the same material and shape as those of the cover of the previous example, the ceiling wall 2a of the cover 2 is intimately contacted with the upper surface 1a' of the body tray 1 at the time of covering the cover 2, thereby forming the wafer-forming groove 1b and the cover 2 of the wafer-forming space S.

When molten silicon base material is filled in the space S through the hole 2c of the cover 2 while rotating the tray body 1 at a predetermined speed, the molten material is filled, flowed by the centrifugal force from the coupler 1d radially outwardly on the wafer-forming unit 1c and the wafer-forming surface 1a, thereby forming thin molten material layer 3. Accordingly, four wafers can be simultaneously formed by cooling and solidifying them in the same manner as the previous case. This wafer can be isolated into four product wafers 4 of square shape by folding by utilizing the portion corresponding to the notched part 1e formed in the boundary between the wafer-forming unit 1c and the coupler 1d.

According to the present invention as described above, the fabrication tray is used for fabricating the polycrystalline silicon wafers, composed of the tray body 1 and the cover 2, formed of a wafer-forming groove 1b integrated via the coupler 1d with a plurality of wafer-forming units 1c on the upper surface 1a' of the tray body 1d, formed at the bottom as a wafer-forming surface 1a, and the cover 2 is composed that the through hole 2c perforated at the center of the cover 2 is communicated with the wafer-forming space S surrounded by the groove 1b, the ceiling wall 2a of the cover 2 in the cover-mounted state. Accordingly, the fabrication tray can be used to simultaneously form a plurality of wafers as compared with the fabrication tray, thereby remarkably improving the productivity, and the wafer of a predetermined thickness may be formed readily by varying the thickness of the wafer.

Figure 6:
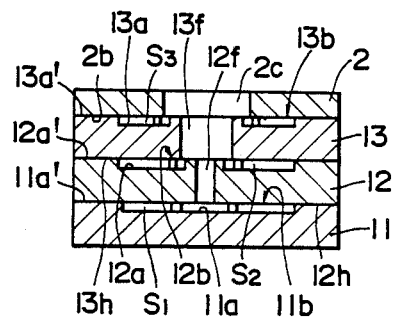
FIG. 6 is a longitudinal sectional front view of a fabrication tray of stack type according to a third embodiment of the present invention.

Then, a fabrication tray constructed according to a third embodiment of the present invention will be described. As shown in FIG. 6 to 11, the tray is formed in stack type. The fabrication tray shown in FIG. 6 is composed of tray bodies 11, 12, 13 stacked in three layers, and the cover 2 placed on the uppermost stage, which are formed of quartz (SiO$_2$) or carbon (C) which is less reactive with the silicon in the same manner as before.

Figure 7A:
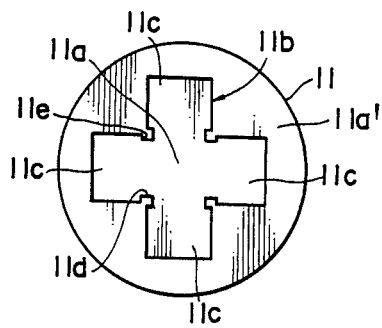
FIGS. 7(a) and 7(b) are respectively plan and longitudinal sectional front views of a tray body with respect to the first layer of the fabrication tray.
Figure 7B:
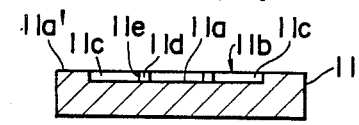
Figure 8A:
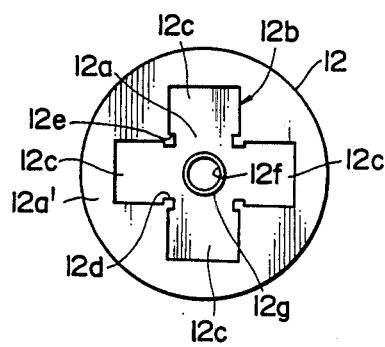
FIGS. 8(a) and 8(b) are respectively plan and longitudinal sectional views of a tray body with respect to the second layer of the tray.
Figure 8B:
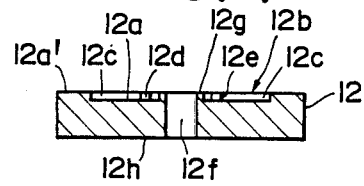

The tray body 11 disposed at the lowermost side is substantially the same as that in FIG. 4, and, as evident by FIGS. 7(a) and 7(b), wafer-forming grooves 11, 11b of planar cross shape are formed on the upper surface 11a', the bottom surface is formed as a wafer-forming surface 11a, and four wafer-forming units 11c of square shape in the exemplified embodiment are formed at the terminal side of the groove 11b, and the coupler 11d communicating with the wafer-forming unit 11c is formed in fine width smaller than the wafer-forming unit 11c, and a notched part 11e is formed at the continuous position of the wafer-forming unit 11c and the coupler 11d.

The tray body 12 of the second layer laminated on the upper surface 11a' of the tray body 11 is formed in a wafer-forming groove 12b of planar cross shape on the tray body 11 of the first layer, the bottom surface is used as wafer-forming surfaces 12a, 12b, four wafer-forming units 12c of square shape are formed at the terminal side of the groove 12b, the coupler 12d communicating with the wafer-forming unit 12c is formed in a fine width smaller than the wafer-forming unit 12c, and the continuous position of the wafer-forming unit 12c and the coupler 12d, thereby forming a notched part 12e.

The tray body 12 is perforated with a through hole 12f passing elevationally substantially at the center, a weir 12g is expanded and formed at the peripheral edge of the upper end of the hole 12f, and formed in the same height at the upper surface 12a' so that the molten materials filled in the wafer-forming groove 12c is not flowed down from the hole 12f. Further, the back surface 12h of the tray 12 is formed smoothly to be intimately contacted with the upper surface 11a of the body 11.

The tray body 13 of the third layer laminated on the upper surface 12a' of the tray body 12 is also formed in a wafer-forming groove 13b of planar cross shape on the upper surface 13a' in the same manner as the tray bodies 11, 12 of the first and second layers, respectively, the bottom surface is used as the wafer-forming plane surface 13a, four wafer-forming units 13c of square shape are formed at the terminal side of the groove 13b, the coupler 13d which connects the respective wafer-forming units 13c is formed in fine width as compared with the wafer-forming unit 13c, and a notched part 13e is formed continuously at both terminals 13c, 13d. The same tray 13 is opened elevationally with a through hole 13d opened through the tray 13 in the same manner as the tray body 12, but the hole 13f is formed to be larger than the outer periphery of the weir 12g, a weir 13g is expanded and formed in the same manner as the tray body 12 at the upper peripheral edge of the hole 13f, and formed in the same height as the upper surface 13a' so that the molten material filled in the groove 12b is not flowed out from the hole 13f, and the back surface 13h of the tray 13 is formed smoothly to be intimately contacted with the upper surface 12a' of the tray body 12.

Figure 10A:
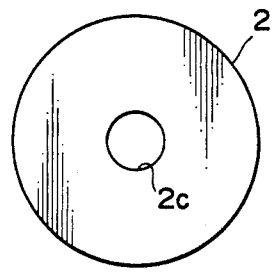
FIGS. 10(a) and 10(b) are respectively plan and longitudinal sectional front views of a cover of the fabrication tray.
Figure 10B:
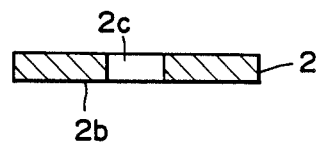

On the other hand, the cover 2 is formed substantially in a profile as the tray bodies 11, 12, 13, and, as shown in FIGS. 10(a) and 10(b), the hole 2c which passed elevationally substantially at the center is formed at the tray body 13 of the highest position at the weir 13g, is formed to be large bore than the diameter of the outer diameter of the weir 13g, and the lower surface 2g of the cover 2 is formed smoothly to be intimately contacted with the upper surface 13a' of the tray body 13.

In order to form the fabrication tray of stack type associated with respective tray bodies 11, 12, 13 and the cover 2 thus constructed, the tray body 11 is first, as shown in FIG. 6, placed on a turntable, not shown, the tray body 12 of the second layer is stacked and placed on the upper surface 11a' of the tray body 11, the tray body 13 of the third layer is stacked and placed on the upper surface of the tray body 12, and the cover 2 is eventually stacked and placed on the upper surface 13a' of the tray body 13. In this case, the through hole 12f of the tray body 12, the through hole 13f of the tray body 13 and the through hole 2c of the cover 2 are arranged concentrically. Therefore, in the stacked stated, the wafer-forming space $S_1$ of the first stage drawn by the wafer-forming groove 11b of the tray body 11 and the back surface 12h of the tray body 12, the wafer-forming space $S_2$ of second stage drawn by the wafer-forming groove 12b of the tray body 12 and the back surface 13h of the tray body 13, and further the wafer-forming space $S_3$ of the third stage drawn by the wafer-forming groove 13b of the tray body 13 and the lower surface 2b of the cover 2 are formed, in this case, the wafer-forming space $S_1$ of the first stage is communicated with the through hole 12f of the tray body 12, the hole 12f is communicated via the wafer-forming space $S_2$ of the second stage with the through hole 13f of the tray body 13, and the groove 13f is formed to communicated with the hole 2c of the cover 2 via the wafer-forming space $S_3$ of the third layer.

Figure 11:
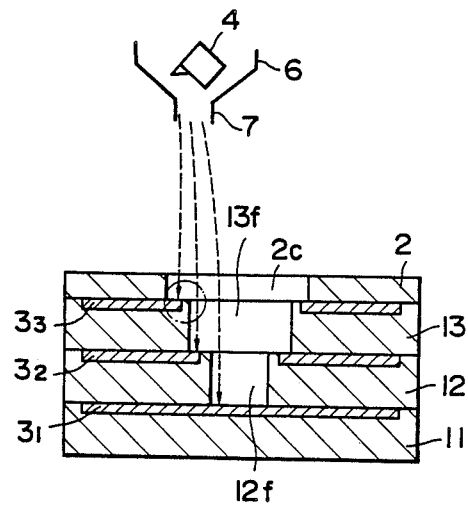
FIG. 11 is an explanatory longitudinal sectional front view of the used state of the fabrication tray during filling of molten base material.

Then, FIG. 11 shows the steps of fabricating the wafer by the fabrication tray relative to the embodiment of FIG. 11. First, molten silicon base material is filled in the hole 2c of the cover 2 while rotating the turntable, not shown, and the tray placed on the turntable at a predetermined speed. In this case, silicon base material is thrown to the crucible 4 in the same manner as shown in FIG. 2, heated and melted by a heat source (not shown) for welding, flowed out to the funnel 6 by tilting the crucible 4, and the molten material is then dropped from the eccentric position of the hole 2c as shown by a midpoint from the outlet 7 in the drawings.

When the molten material is thus supplied from the hole 2c, the molten material is filled in the wafer-forming spaces $S_1$, $S_2$, $S_3$, radially outwardly flowed on the wafer-forming surfaces 11a, 12a, 13a from the couplers 11d, 12d, 13d toward the wafer-forming units 11c, 12c, 13c. Thus, when all the wafer-forming units 11c, 12c, 13c are filled with the molten material, and thin molten material layers $3_1$, $3_2$, $3_3$ formed, cooled, solidified, thereby forming four each tray bodies 11, 12, 13, total to 12 sheets of wafers simultaneously. The wafers are folded by utilizing the positions corresponding to the notched parts 11e, 12e, 13e provided at the boundary between the wafer-forming units 11c, 12c, 13c and the couplers 11d, 12d, 13d, thereby dividing it into product wafers of square shape.

Figure 12:
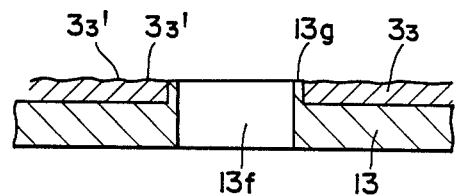
FIG. 12 is an explanatory, enlarged longitudinal sectional front view of the essential part of the tray in FIG. 11.

The product wafer thus obtained is surrounded at the front and back surfaces of the wafer, and at the outer peripheral surface by the grooves 11b, 12b, 13b of the respective tray bodies 11, 12, 13, the front surfaces 12h, 13h, 2b of the tray body 12, 13 and the cover 2. Thus, when the thin molten materials $3_1$, $3_2$, $3_3$, are generally cooled and solidified, irregularity caused by the projections $3_3'$, . . . are formed as shown in FIG. 12 on the free surface. However, since the irregularity is suppressed by the back surfaces 12h, 13h and the lower surface 2b, a wafer having smooth surfaces can be formed. Further, the remaining part of the thin molten material layer formed except the wafer-forming units 11c, 12c, 13c is isolated from the fabrication tray, and again molten for use.

In the embodiments described above, the fabrication tray is formed, as an example, of three layers. However, the present invention is not limited only to this particular embodiments, but may be formed of two or more layers.

As exemplified in the above-described embodiments of the present invention, the fabrication tray of third embodiment of the invention is constructed by supplying molten liquid of silicon base material onto the rotating wafer-forming surface, flowing radially outwardly the material by the centrifugal force produced by the rotation, thereby forming a thin molten material layer of the molten material in a predetermined size, solidifying the layer for fabricating a polycrystalline silicon wafer thus solidified, which tray comprises tray bodies 11, 12, 13 of more than two layers and a cover 2 superposed at the uppermost position, so that wafer-forming grooves 11b, 12b, 13b are formed on the upper surfaces 11a', 12a', 13a' of the respective tray bodies, the bottom surfaces are formed as the wafer-forming surfaces 11a, 12a, 13a, through holes 12f, 13f are perforated substantially at the centers of the stacked tray bodies of the tray bodies, a through hole 2c is perforated substantially at the center of the cover 2 in communicated state from each other, and wafer-forming spaces $S_1$, $S_2$, $S_3$ formed in a predetermined number of the cover 2 and the respective tray bodies are respectively opened at the holes 12f, 13d and 2c. Accordingly, difficulties of conventional ingot-slicing method or a ribbon method can be eliminated. In addition, the wafer is not pressed by the surfaces of the casting mold as the conventional casting method, and a plurality of products, or wafers can be fabricated simultaneously in one fabricating step. Consequently, the operating efficiency of a facility can be largely improved, the cost of the product can be reduced, and the operating efficiency of the fabricating facility can be remarkably improved by forming a number of silicon wafers in one fabricating step as compared with the fabrication tray of the second embodiment of the invention, with the result that the cost-reduction of the wafers can be achieved in a fabrication tray of stack type.

The fourth embodiment of the fabrication tray according to this invention will be further described. In this embodiment of the fabrication tray, a wafer-forming groove 1b formed in the tray body 1 is improved, wafer-forming units 1c, 1c, . . . respectively formed at the outside terminal of the grooves 1b are formed at suitable displaced positions, the filling part 1i of the central part in which molten material is filled, and the wafer-forming units 1c, 1c, . . . are composed to communicate via couplers 1d, 1d, . . . Thus, the flow of molten silicon base material by the rotary centrifugal force can be improved, enabling to uniformly flow the molten material over the entire area of the wafer-forming units, increasing the size of the wafer-forming units, and enabling to fabricate a silicon sheet of large size with a predetermined large thickness by the fabrication tray.

Figure 13A:
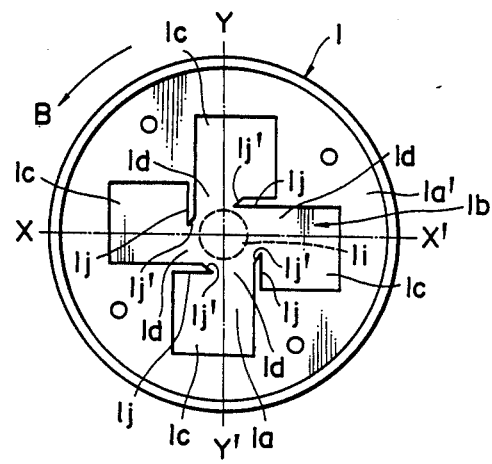
FIG. 13(a) is a plan view showing the tray body of the fabrication tray according to the fourth embodiment of the present invention.
Figure 13B:
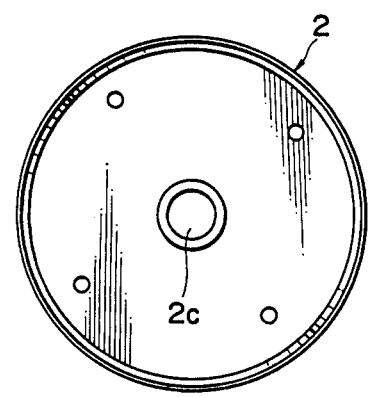
FIG. 13(b) is a plan view of the cover.
Figure 15:
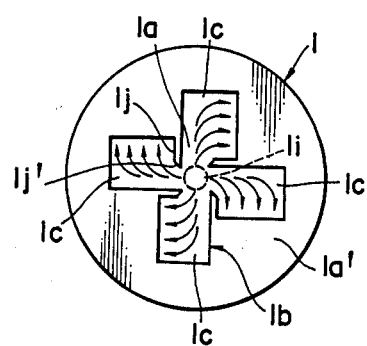
FIG. 15 is an explanatory, plan view showing the enlarged diameter flowing state of molten silicon base material in the tray.

The fabrication tray of this embodiment will be described in more detail with reference to the embodiment shown in FIGS. 13(a) and 13(b). The fabrication tray is composed of a tray body 1, as shown in FIG. 13(a), and a cover 2, as shown in FIG. 13(b), which are formed of quartz ($SiO_2$) or carbon (C) which is less reactive with the silicon in the same manner as that in FIG. 5.

The tray body 1 is composed by forming a silicon-forming groove 1b of substantially planar eccentric cross shape on the upper surface 1a' formed flatly, forming the bottom surface in a wafer-forming surface 1a, and forming four wafer-forming units 1c of square shape at the end of the groove 1b, in the exemplified embodiment.

Then, these wafer-forming units 1c, . . . communicate with the filling part 1i of the center, weirs 1j projected from the side are respectively formed in substantially perpendicularly crossed state to the communicating direction are formed at the connecting parts of the respective wafer-forming units 1c and the filling part 1i, thereby communicating with the wafer-forming units 1c, 1c, by communicating sheaths 1d, 1d formed narrowly in fine width as compared with the wafer-forming units 1c at the filling part 1i.

Figure 14:
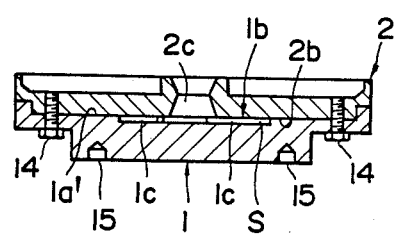
FIG. 14 is a longitudinal sectional front view of the fabrication tray.

The cover 2 is detachably clamped by screws 14, . . . , as shown in FIG. 14 on the upper surface 1a' of the tray body 1, the cover 2 is perforated with a through hole 3c at the position corresponding to the filling part 1i of the groove 1b at the tray body 1 at the center in the same manner as the previous embodiments, and the lower surface 2g of the cover 2 is formed smoothly to be intimately contacted with the upper surface 1a' of the tray body 1.

In order to construct a fabrication tray associated with the tray body 1 and the cover 2 thus formed, the tray body 1 is first placed, as shown in FIG. 14 on a turntable, not shown, holes 15 perforated at the bottom surface are clamped to a connecting bolt (not shown) of the turntable, the cover 2 is then stacked and placed on the upper surface 1a' of the tray body 1, and are detachably clamped by screws 14, . . .

Therefore, in the above associated state, wafer-forming units 1c, . . . at the ends of the wafer-forming grooves 1b of the tray body 1 and the wafer-forming space S formed by the lower surface 2b of the cover 2 are formed, and the wafer-forming spaces S, . . . are composed to communicate with the hole 2c of the cover 2 via the filling part 1i and the communicating parts 1d, 1d.

The wafer-forming units 1c, . . . of the wafer-forming grooves 1b of the tray body 1 are displaced in the prescribed redial direction passing the center of the tray body 1, i.e., rightwardly or leftwardly of the circumferential direction at the center from the lines X—X', Y—Y' of biaxial direction as shown.

More particularly, when the fabrication tray is rotated in the direction of an arrow B in FIG. 13(a), the wafer-forming units 1c, . . . are displaced clockwise of circumferential direction to the lines X—X', Y—Y' as shown, and when rotated oppositely in the direction of the arrow B, they are displaced counterclockwise of the circumferential direction. The weirs 1j are formed to be projected from the side displaced at the continuous position as shown, and when displaced counterclockwisely opposite to the above-described case, they are projected oppositely from the side opposite to that as shown. Further, when the communicating parts 1d, 1d, . . . are provided on the prescribed radial line of X—X', Y—Y' without substantial displacement, molten silicon dropped and filled at the center in the filling part 1i of the rotated fabrication tray is directed by the rotation in the direction of an arrow in FIG. 14, thereby allowing the molten silicon to be uniformly flowed to the corners of the wafer-forming units.

When an oblique surface 1j' is formed toward the flowing direction of the molten silicon at the ends of the respective weirs 1j as shown by an arrow in FIG. 14, the flow of the molten silicon can be further improved to the wafer-forming units 1c.

In the fabrication tray of the structure thus constructed, when a silicon wafer is fabricated by using the tray, the fabrication tray shown in FIG. 14 is placed on a turntable, not shown, rotated at a predetermined speed, and molten silicon is filled from the hole 2c of the cover 2. In this case, in the exemplified embodiment, the fabrication tray is rotated in the direction of an arrow B in FIG. 13(a).

When the molten silicon is filled from the hole 2c, the molten silicon is filled and dropped to the center of the filling part 1i of the wafer-forming surface 1a. Thus, the molten silicon is radially outwardly flowed on the wafer-forming surface 1a by the centrifugal force of the rotated fabrication tray from the respective communicating parts 1d, 1d, ... to the respective wafer-forming units 1c, 1c, ..., flowed into the respective wafer-forming spaces S. In this case, since the weirs 1j projected toward the direction as shown are provided at the communicating parts 1d, 1d, ... to the rotating direction designated by an arrow B of the fabrication tray, the molten silicon can be flowed in the direction of an arrow in FIG. 14, i.e., from the left to the right of the spaces S, can be flowed uniformly over the entire wafer-forming spaces S, and the thin molten material layer is formed in the wafer-forming spaces S. Then, the layer is cooled and solidified, thereby forming four silicon wafers simultaneously in the embodiment shown.

The silicon wafers thus fabricated are divided, even in this case, into product wafers of square shape by folding it by utilizing the positions of the communicating parts 1d, 1d, ... between the wafer-forming units 1c, 1c, ... and the filling part 1i.

The wafer thus fabricated is surrounded at the front, back surfaces and the outer peripheral surface by the wafer-forming grooves 1b of the tray body 1 and the wafer-forming surfaces 1a of the tray body 1 and the lower surface 2b of the cover 2. Accordingly, when the thin molten material layer is cooled and solidified by the surfaces, irregularity formed on the surface can be suppressed, and the wafer having smooth surfaces can be formed.

According to the fabrication tray of the invention as described above, there is provided a fabrication tray which has a tray body 1 formed with wafer-forming units 1c, ... at the end side of wafer-forming groove 1b formed on the upper surface thereof, a cover 2 surrounding the wafer-forming spaces S, ... engaged on the tray body 1 by perforating a through hole 2c at the center thereof, for fabricating a polycrystalline silicon wafer by supplying molten liquid of silicon base material from the hole 2c of the cover 2 to the filling part 1i on the rotated wafer-forming surface 1a of the groove 1b in a predetermined atmosphere, forming a thin molten material layer by rotary centrifugal force, and solidifying the layer, which tray comprises wafer-forming units 1c, 1c, ... of a predetermined shape displaced from leftward to rightward of circumferential direction from a predetermined radial direction formed at the end side of the groove 1b of the tray body 1, and communicated via communicating parts 1d, 1d formed on the predetermined radial line to the filling part 1i. Accordingly, the molten silicon to be filled to filling part 1i of the rotated wafer-forming surface 1a is bent and flowed from the communicating part 1d toward the wafer-forming unit 1c, thereby sufficiently diffusing the molten silicon liquid. Therefore, the molten silicon can be flowed uniformly over the entire wafer-forming spaces S, a thin molten material layer having regular thickness is formed in a predetermined shape, thereby fabricating the silicon wafer of high quality.

Since sufficient diffusion of molten silicon liquid can be enabled as described above, the size of the wafer-forming unit 1c can be increased considerably by the presently using fabricating tray, and the silicon wafer of large size can be readily fabricated.

What is claimed is:

1. A fabrication tray arrangement for producing a plurality of polycrystalline silicon wafers when liquid silicon material is poured therein and the tray arrangement is rapidly rotated so that the liquid material is spread outwardly by centrifugal force, comprising:
   (1) a turntable and associated means to rapidly rotate said turntable;
   (2) a vertical stack of circular wafer-forming tray bodies supported concentrically by said turntable including a top and a bottom tray body, each tray body except the bottom tray body having a substantially central aperture, the apertures being aligned, the aperture of the top tray body being larger than that of the tray next to the top body, the aperture or apertures of the lower tray body or bodies being progressively smaller than that of the aperture or apertures of the upper tray bodies;
   (3) wafer forming cross-shaped grooves in each tray body arranged so as to form four substantially square wafers when liquid material is flowed thereon, said squares having an inner portion towards the apertures, a coupling communicating between wafer units forming a notched part at each inner portion to separate the wafers;
   (4) a stack cover having a central aperture for receiving liquid material therethrough stacked on top of said vertical stack of tray bodies with its aperture aligned with the apertures of said vertical stack of tray bodies; and
   (5) means to pour silicon liquid through the cover aperture and into the wafer forming grooves.

* * * * *